United States Patent
Kai et al.

(10) Patent No.: US 6,468,714 B2
(45) Date of Patent: Oct. 22, 2002

(54) NEGATIVE RADIATION-SENSITIVE RESIN COMPOSITION

(75) Inventors: Toshiyuki Kai; Yong Wang; Shirou Kusumoto; Yoshihisa Ohta, all of Yokkaichi (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 09/741,334

(22) Filed: Dec. 21, 2000

(65) Prior Publication Data

US 2001/0006758 A1 Jul. 5, 2001

(30) Foreign Application Priority Data

Dec. 24, 1999 (JP) ............................................. 11-367575

(51) Int. Cl.⁷ ............................................... G03F 7/004
(52) U.S. Cl. ..................... 430/270.1; 430/914; 430/921
(58) Field of Search ............................... 430/270.1, 914, 430/921

(56) References Cited

FOREIGN PATENT DOCUMENTS

| EP | 0 849 634 | | 6/1998 |
|---|---|---|---|
| JP | 10-254135 | * | 9/1998 |

OTHER PUBLICATIONS

Database WPI, Section Ch, Week 199849, Derwent Publications Ltd., London, GB, AN 1998–572563 XP002162944 & JP 10 254135 A (Nippon Gosei Gomu KK), Sep. 25, 1998 *abstract*.

Patent Abstracts of Japan, vol. 1998, No. 04, Mar. 31, 1998 & JP 09 309874 A (Fuji Photo Film Co., Ltd.) Dec. 1997 *abstract*.

machine translation of JP 10–254135.*

* cited by examiner

*Primary Examiner*—Rosemary Ashton
(74) *Attorney, Agent, or Firm*—Piper Rudnick LLP; Steven B. Kelber

(57) ABSTRACT

A negative radiation-sensitive resin composition including (A) an alkali-soluble resin containing a copolymer selected from the group consisting of a hydroxystyrene/styrene copolymer having hydroxystyrene units in a content of from 65 to 90 mol % and a hydroxystyrene/α-methylstyrene copolymer having hydroxystyrene units in a content of from 65 to 90 mol %, (B) a radiation-sensitive acid-generating agent containing a hydroxyl group-containing onium salt compound, and (C) a cross-linking agent containing an N-(alkoxymethyl)glycoluril compound. The composition is suitable as a chemically amplified negative resist, to which alkaline developing solutions having usual concentration are applicable and which can form, in usual line-and-space patterns, resist patterns having a rectangular cross-sectional shape in a high resolution and also has superior sensitivity, developability and dimensional fidelity.

14 Claims, No Drawings

NEGATIVE RADIATION-SENSITIVE RESIN COMPOSITION

BACKGROUND OF THE INVENTION

1. Field of the Invention

This invention relates to a radiation-sensitive resin composition, and more particularly to a negative radiation-sensitive resin composition useful as a chemically amplified resist suited for fine processing using radiations such as far-ultraviolet radiations, X-radiations and charged-particle radiations.

2. Description of the Prior Art

In the field of fine processing as typified by the fabrication of integrated-circuit devices, the size of processing in lithography is being rapidly made finer in order to achieve a higher degree of integration. In recent years, there is a demand for techniques that enable stable fine processing in a line width of 0.25 $\mu$m or smaller. Accordingly, resists used therein are also required to enable formation of fine patterns of 0.25 $\mu$m or finer in a high precision. From such a viewpoint, lithography that utilizes radiations having a shorter wavelength is studied.

As radiations having such a short wavelength, used are far-ultraviolet radiations of KrF excimer lasers (wavelength: 248 nm) and ArF excimer lasers (wavelength: 193 nm), X-radiations such as synchrotron radiations, and charged-particle radiations such as electron radiations. In recent years, various resists adaptable to such radiations are studied. As those which especially attract notice among such resists, what is called "chemically amplified resist" is known in which an acid is generated by irradiation with radiations (hereinafter "exposure") and the reaction takes place to cause a chemical change in the solubility of the resist to a developing solution by the catalytic action of this acid.

Now, when integrated circuits are actually fabricated using resists, usually resist constituents such as a radiation-sensitive component and a film-forming resin component are dissolved in a solvent to prepare a resist solution, and the resist solution is coated on a substrate which is to be processed, to form a resist film. Thereafter, the resist film is exposed to light via a given mask and then developed to form a pattern suited for fine processing. The shape of cross sections of the pattern formed there (pattern cross-sectional shape) affects the precision of fine processing greatly, and a rectangular shape is considered preferable. Conventional chemically amplified negative resists, in which the pattern is formed by making cross-linking reaction proceed at exposed areas to lower the rate of dissolution of resist in developing solution in that area, have a disadvantage that the rate of dissolution of the resist in the developing solution does not contrast sufficiently between exposed areas and unexposed areas and hence a low resolution may result and the pattern may have not square but round top edges in its cross section. Moreover, the rate of dissolution of resist in developing solution can not sufficiently be lowered in the exposed area, bringing about difficulties that the pattern is swelled by the developing solution or formed serpentinely.

Japanese Laid-open Publication (Kokai) Nos. 1-293339 and 2-15270 disclose chemically amplified negative resist compositions making use of amino resins such as glycoluril resin as cross-linking agents. However, where cross-linking agents are merely selected, it has been difficult to form fine patterns of 0.25 $\mu$m or finer on a satisfactory level.

Meanwhile, Japanese Laid-open Publication (Kokai) No. 6-301200 discloses a chemically amplified negative resist composition making use of a cross-linking agent comprised of N-(alkoxymethyl)glycoluril compound. This composition, however, has had a problem that an aqueous 2.38% by weight tetramethylammonium hydroxide solution usually used as a developing solution in the fabrication of integrated-circuit devices is not applicable.

Japanese Laid-open Publication (Kokai) No. 5-34922 also discloses a proposal of a chemically amplified negative resist composition containing a partial hydrogenation phenolic resin and a glycoluril resin cross-linking agent whose mononuclear-structure proportion has been specified. However, in an attempt to form fine patters of 0.25 $\mu$m or finer by using this resist composition, it has been impossible to achieve any satisfactory performance. Also, if the mononuclear-structure proportion in the cross-linking agent used in the resist composition is too high, the resist may have a very high sensitivity. Such a resist may cause a great dimensional change of the pattern, with changes in exposure (quantity of light). This point rather comes into question in respect of processes for fabricating fine-pattern integrated-circuit devices.

In more recent years, as chemically amplified negative resist compositions improved especially in resolution, Japanese Laid-open Publication (Kokai) Nos. 7-120924, 7-311463, 8-44061 and so forth disclose compositions whose degree of dispersion of alkali-soluble resin has been specified. However, these resist compositions can also not yet be satisfactory in respect of the resolution, pattern cross-sectional shape and dimensional fidelity that are important as characteristics of usual negative resists.

SUMMARY OF THE INVENTION

An object of the present invention is to provide a negative radiation-sensitive resin composition suitable as a chemically amplified negative resist, to which alkaline developing solutions having usual concentration are applicable and which can form, in usual line-and-space patterns, resist patterns having a rectangular cross-sectional shape in a high resolution and also has superior sensitivity, developability and dimensional fidelity.

According to the present invention, the above object can be achieved by a negative radiation-sensitive resin composition comprising:

(A) an alkali-soluble resin containing at least one copolymer selected from the group consisting of a hydroxystyrene/styrene copolymer having hydroxystyrene units in a content of from 65 to 90 mol % and a hydroxystyrene/$\alpha$-methylstyrene copolymer having hydroxystyrene units in a content of from 65 to 90 mol %;

(B) a radiation-sensitive acid-generating agent containing a hydroxyl group-containing onium salt compound; and (C) a cross-linking agent containing an N-(alkoxymethyl) glycoluril compound.

DETAILED DESCRIPTION OF THE INVENTION

The present invention will be described below in detail.

(A) Alkali-soluble Resin

The alkali-soluble resin in the present invention comprises a resin containing as essential components at least one copolymer selected from the group consisting of a hydroxystyrene/styrene copolymer having hydroxystyrene units in a content of from 65 to 90 mol % and a hydroxystyrene/$\alpha$-methylstyrene copolymer having hydroxystyrene units in a content of from 65 to 90 mol %

(these copolymers are hereinafter called "specific hydroxystyrene copolymer" generically). The hydroxystyrene units contained in this specific hydroxystyrene copolymer may preferably be in a content of from 70 to 90 mol %, and more preferably from 70 to 85 mol %. In this case, if the hydroxystyrene units in the hydroxystyrene/styrene copolymer and hydroxystyrene/α-methylstyrene are in a content less than 65 mol %, the composition may have a low rate of dissolution in alkaline developing solutions to damage developability, resolution and so forth required as resists. If on the other hand they are in a content more than 90 mol %, a poor pattern cross-sectional shape may result.

The specific hydroxystyrene copolymer may also have a weight-average molecular weight (hereinafter "Mw") of from 2,000 to 8,000, and preferably from 3,000 to 7,000, in terms of polystyrene as measured by gel permeation chromatography, and also a degree of dispersion of 1.8 or below, and preferably 1.5 or below, as defined by a ratio of Mw to number-average molecular weight (hereinafter "Mn") in terms of polystyrene as measured by gel permeation chromatography, Mw/Mn. In this case, if the specific hydroxystyrene copolymer has an Mw less than 2,000, the composition tends to have low film-forming properties and have a low sensitivity as a resist. If on the other hand it has an Mw more than 8,000, the composition tends to provide low developability, resolution and so forth as a resist. If the composition has a degree of dispersion above 1.8, the composition tends to provide low resolution and so forth as a resist.

The hydroxystyrene in the specific hydroxystyrene copolymer may include o-hydroxystyrene, m-hydroxystyrene and p-hydroxystyrene. Any of these hydroxystyrenes may be used singly or in the form of a mixture of two or more.

As specific examples of such a specific hydroxystyrene copolymer, it may include o-hydroxystyrene/styrene copolymer, o-hydroxystyrene/α-methylstyrene copolymer, m-hydroxystyrene/styrene copolymer, m-hydroxystyrene/α-methylstyrene copolymer, p-hydroxystyrene/styrene copolymer, and p-hydroxystyrene/α-methylstyrene copolymer. Of these copolymers, p-hydroxystyrene/styrene copolymer is particularly preferred.

In the present invention, the specific hydroxystyrene copolymer may be used singly or in the form of a mixture of two or more.

As a method for producing the specific hydroxystyrene copolymer, it may include, e.g.,;

(i) a method in which a monomer the hydroxyl group of hydroxystyrene units of which has been protected, as exemplified by butoxycarbonyloxystyrene, butoxystyrene, acetoxystyrene or tetrahydropyranyloxystyrene is subjected to addition polymerization with styrene and/or α-methylstyrene, and thereafter an acid catalyst or a basic catalyst is allowed to act to eliminate the protective group by hydrolysis; and (ii) a method in which hydroxystyrene is subjected to addition polymerization with styrene and/or α-methylstyrene. The method (i) is preferred.

The above addition polymerization may be carried out by an appropriate process, e.g., radical polymerization, anionic polymerization, cationic polymerization or thermal polymerization. Anionic polymerization or cationic polymerization is preferred in view of an advantage that the copolymer obtained can have a small degree of dispersion. Also, as the acid catalyst used in the method (i), it may include, e.g., inorganic acids such as hydrochloric acid and sulfuric acid.

As the basic catalyst, it may include, e.g., organic bases such as trialkylamines and inorganic bases such as sodium hydroxide.

(B) Radiation-sensitive Acid-generating Agent

The component-(B) radiation-sensitive acid-generating agent (hereinafter simply "acid-generating agent") contains a hydroxyl group-containing onium salt compound.

The hydroxyl group-containing onium salt compound usable in the present invention may include, e.g., sulfonium salts and iodonium salts.

Hydroxyl-group-containing onium salt compounds preferred in the present invention are compounds represented by the following general formulas (I) and (II).

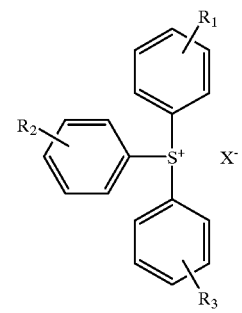

(I)

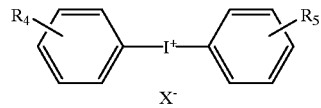

(II)

In the general formula (I), $R_1$ to $R_3$ may be the same or different and each represent a hydroxyl group, a hydrogen atom, a halogen atom, an alkoxyl group, an alkyl group or a haloalkyl group, and it is essential that at least one is a hydroxyl group.

In the general formula (II), $R_4$ and $R_5$ may be the same or different and each represent a hydroxyl group, a hydrogen atom, a halogen atom, an alkoxyl group, an alkyl group or a haloalkyl group, and it is essential that at least one is a hydroxyl group.

$X^-$ represents a sulfonate anion, which may include, e.g., trifluoromethanesulfonate, nonafluorobutanesulfonate, toluenesulfonate and camphorsulfonate.

As specific examples of the compounds of the general formulas (I) and (II), they may include diphenyl-4-hydroxyphenylsulfonium trifluoromethanesulfonate, bis(4-fluorophenyl)-4-hydroxyphenylsulfonium trifluoromethanesulfonate, bis(4-methoxyphenyl)-4-hydroxyphenylsulfonium trifluoromethanesulfonate, diphenyl-4-hydroxyphenylsulfonium nonafluorobutanesulfonate, diphenyl-4-hydroxyphenyl toluenesulfonate, diphenyl-4-hydroxyphenyl camphorsulfonate, bis(4-hydroxyphenyl,)-phenylsulfonium trifluoromethanesulfonate, tri(4-hydroxyphenyl)sulfonium trifluoromethanesulfonate, 4-hydroxyphenyl-phenyliodonium trifluoromethanesulfonate and bis(4-hydroxyphenyl)sulfonium trifluoromethanesulfonate. Of these hydroxyl group-containing onium salt compounds, sulfonium compounds are particularly preferred, and more preferred are diphenyl-4-hydroxyphenylsulfonium trifluoromethanesulfonate, bis(4-fluorophenyl)-4-hydroxyphenylsulfonium trifluoromethanesulfonate. Also, the above hydroxyl group-containing onium salt compound may be used singly or in the form of a mixture of two or more.

The hydroxyl group-containing onium salt compound in the present invention may usually be mixed in an amount of from 0.1 to 10 parts by weight, preferably from 0.5 to 7 parts by weight, and more preferably from 1 to 5 parts by weight, based on 100 parts by weight of the component-(A) alkali-soluble resin. If the hydroxyl group-containing onium salt compound is in too small a quantity, the composition may provide a low resolution. If it is in too large a quantity, a poor pattern cross-sectional shape may result.

The acid-generating agent in the present invention may optionally further contain an additional acid-generating agent. Such an additional acid-generating agent may include, e.g., halogen-containing compounds, sulfone compounds, sulfonate compounds and quinonediazide compounds which are disclosed in Japanese Laid-open Publication (Kokai) No. 7-306531. Any of these acid-generating agents may be used singly or in the form of a mixture of two or more.

(C) Cross-linking Agent

The cross-linking agent in the present invention contains N-(alkoxymethyl)glycoluril compound, and is a component capable of cross-linking the component-(A) alkali-soluble resin in the presence of an acid, e.g., an acid generated upon exposure.

The N-(alkoxymethyl)glycoluril compound may include, e.g., compounds having at least one alkoxyl group having 1 to 5 carbon atoms. A preferred compound is an N,N,N,N-tetra(alkoxymethyl)glycoluril represented by the following general formula (III):

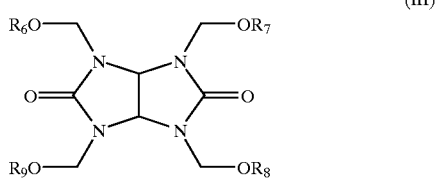

(III)

wherein $R_6$, $R_7$, $R_8$ and $R_9$ each independently represent an alkyl group having 1 to 4 carbon atoms.

As specific examples of the N,N,N,N-tetra(alkoxymethyl)glycoluril, it may include, e.g., N,N,N,N-tetra(methoxymethyl)glycoluril, N,N,N,N-tetra(ethoxymethyl)glycoluril, N,N,N,N-tetra(n-propoxymethyl)glycoluril, N,N,N,N-tetra(i-propoxymethyl)glycoluril, N,N,N,N-tetra(n-butoxymethyl)glycoluril and N,N,N,N-tetra(t-butoxymethyl)glycoluril. Of these N,N,N,N-tetra(alkoxymethyl)glycolurils, N,N,N,N-tetra(methoxymethyl)glycoluril is particularly preferred. The above N,N,N,N-tetra(alkoxymethyl)glycoluril may be used singly or in the form of a mixture of two or more.

The cross-linking agent in the present invention may usually be mixed in an amount of from 2 to 30 parts by weight, preferably from 3 to 20 parts by weight, and more preferably from 4 to 10 parts by weight, based on 100 parts by weight of the component-(A) alkali-soluble resin. In this case, if the cross-linking agent is in too small a quantity, it may be difficult to make cross-linking reaction proceed sufficiently, so that as a resist the composition may provide a low yield of residual film thickness or the pattern tends to be swelled by the developing solution or formed serpentinely. If on the other hand it is in too large a quantity, the composition tends to provide a low resolution and a greatly rough pattern as a resist.

Other Components

Acid diffusion control agent:

In the present invention, an acid diffusion control agent may preferably be mixed which acts to control a phenomenon where the acid generated from the acid-generating agent upon exposure diffuses into resist films and to control any unwanted chemical reaction from taking place in unexposed areas. Use of such an acid-diffusion control agent brings about an improvement in storage stability of the negative radiation-sensitive resin composition, and also, as a resist, can keep resist pattern line width from changing because of variations of post-exposure time delay (PED) after exposure, promising a very good processing stability. Such an acid diffusion control agent may include nitrogen-containing basic compounds, and radiation-decomposable basic compounds such as basic sulfonium compounds and basic iodonium compounds.

The nitrogen-containing basic compounds may specifically include pyridines such as 2-phenylpyridine, 3-phenylpyridine, 4-phenylpyridine, 2-benzylpyridine and nicotinic acid amide, or derivatives thereof; aminoaromatic compounds such as N-methylaniline, N,N-di-methylaniline and 4,4'-diaminodiphenylmethane, or derivatives thereof; and alkylamines such as trimethylamine, triethylamine, tri-n-propylamine, tri-i-propylamine, tri-n-butylamine, tri-t-butylamine, tri-n-hexylamine and tri-n-octylamine, in particular, tertiary amines.

The radiation-decomposable basic compounds may include compounds represented by the following general formulas (IV) and (V).

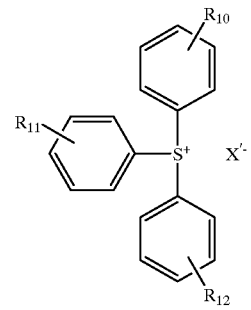

(IV)

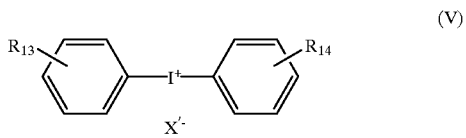

(V)

In the general formula (IV), $R_{10}$ to $R_{12}$ may be the same or different and each represent a hydrogen atom, an alkyl group, an alkoxyl group, a hydroxyl group or a halogen atom. In the general formula (V), $R_{13}$ and $R_{14}$ may be the same or different and each represent a hydrogen atom, an alkyl group, an alkoxyl group or a halogen atom. In each formula, $X'^-$ represents a hydroxyl, salicylate or $RCOO^-$ anion where R is a $C_1$ to $C_{10}$ alkyl group, an aryl group or an alkaryl group.

As examples of the compounds of the general formulas (IV) and (V), they may specifically include triphenylsulfonium hydroxide, triphenylsulfonium salicylate, diphenyl-4-hydroxyphenylsulfonium salicylate and bis(4-t-butylphenyl) iodonium salicylate.

The above acid-diffusion control agent may be used singly or in the form of a mixture of two or more.

The acid-diffusion control agent in the present invention may usually be mixed in an amount of from 0.001 to 10 parts by weight, preferably from 0.005 to 5 parts by weight, and more preferably from 0.01 to 3 parts by weight, based on 100 parts by weight of the component-(A) alkali-soluble resin. In this case, if the acid-diffusion control agent is in too small a quantity, the composition tends to provide poor pattern cross-sectional shape and dimensional fidelity as a resist, and may further require a long post-exposure time delay (PED) to tend to provide a poor pattern cross-sectional shape at upper-layer portions of the pattern. If on the other hand the acid-diffusion control agent is in too large a quantity, the composition tends to have a low sensitivity and a low developability at unexposed areas as a resist.

Additives:

The negative radiation-sensitive resin composition of the present invention may further be mixed with various additives such as a dissolution control agent, a dissolution acceleration agent, a sensitizer and a surface-active agent.

The dissolution control agent is a component having the action to control any too high solubility of the (A) alkali-soluble resin in alkaline developing solutions to appropriately decrease the rate of dissolution of the resin at the time of alkaline development. Such a dissolution control agent may preferably be those which may cause no chemical change in the course of resist-film baking, exposure, development and so forth.

The dissolution control agent may include, e.g., aromatic hydrocarbons such as naphthalene, phenanthrene, anthracene and acenaphthene; ketones such as acetophenone, benzophenone and phenyl naphthyl ketone; and sulfones such as methyl phenyl sulfone, diphenyl sulfone and dinaphthyl sulfone. Any of these dissolution control agents may be used singly or in the form of a mixture of two or more, The dissolution control agent may usually be mixed in an amount not more than 50 parts by weight, and preferably not more than 30 parts by weight, based on 100 parts by weight of the component-(A) alkali-soluble resin, which may appropriately be adjusted depending on the type of the component-(A) alkali-soluble resin used.

The dissolution acceleration agent is a component having the action to enhance any too low solubility of the (A) alkali-soluble resin in alkaline developing solutions to appropriately increase the rate of dissolution of the resin at the time of alkaline development. Such a dissolution acceleration agent may preferably be those which may cause no chemical change in the course of resit-film baking, exposure, development and so forth.

The dissolution acceleration agent may include, e.g., low-molecular-weight phenolic compounds having 2 to 6 benzene rings, specifically including, e.g., bisphenols and tris(hydroxyphenyl)methane. Any of these dissolution acceleration agents may be used singly or in the form of a mixture of two or more.

The dissolution acceleration agent may usually be mixed in an amount not more than 50 parts by weight, and preferably not more than 30 parts by weight, based on 100 parts by weight of the component-(A) alkali-soluble resin, which may appropriately be adjusted depending on the type of the component-(A) alkali-soluble resin used.

The sensitizer is a component having the action to absorb energy of radiations emitted for exposure and transmit the energy to the acid-generating agent to enlarge the quantity of the acid to be generated, to thereby improve apparent sensitivity of the resist.

Such a sensitizer may include, e.g., benzophenones, biacetyls, pyrenes, phenothiazines, eosine, and rose iron oxide red. Any of these sensitizers may be used singly or in the form of a mixture of two or more.

The sensitizer may usually be mixed in an amount not more than 50 parts by weight, and preferably not more than 30 parts by weight, based on 100 parts by weight of the component-(A) alkali-soluble resin, The surface-active agent is a component having the action to improve coating properties or storage stability of the negative radiation-sensitive resin composition of the present invention, its developability as a resist, and so forth.

Such a surface-active agent may include anionic types, cationic types, nonionic types and amphoteric types, any of which may be used. Preferred surface-active agents are nonionic surface-active agents. As examples of the nonionic surface-active agents, they may include polyoxyethylene higher alkyl ethers, polyoxyethylene higher alkyl phenyl ethers, and higher-fatty-acid diesters of polyethylene glycol, as well as a series of those commercially available under trade names of F-TOP (available from TOHKEM Products Co.), MEGAFAX (available from Dainippon Ink & Chemicals, Inc.), FLORARD (available from Sumitomo 3M Limited), ASAHI GUARD, SURFLON (both available from Asahi Glass Co., Ltd.), PEPOL (available from Toho Chemical Industry Co., Ltd.), KP (available from Shin-Etsu Chemical Co., Ltd.), POLYFLOW (Kyoeisha Chemical Co., Ltd.).

The surface-active agent may usually be mixed, as effective component of the surface-active agent, in an amount not more than 2 parts by weight based on 100 parts by weight of the component-(A) alkali-soluble resin.

A dye or pigment may also be mixed so that latent images at exposed areas can be made visible to relieve any effect of halation at the time of exposure, and an adhesive auxiliary may be mixed so that the adhesion to substrates can be improved.

Solvents:

The negative radiation-sensitive resin composition of the present invention is, when used, dissolved in a solvent so as to be in a solid concentration of usually from 5 to 50% by weight, followed by filtration with a filter having a pore size of, e.g., about 0.2 $\mu$m, and prepared into a resist solution.

The solvent used in preparing the resist solution may include, e.g., ethylene glycol monoalkyl ether acetates such as ethylene glycol monomethyl ether acetate, ethylene glycol monoethyl ether acetate, ethylene glycol monopropyl ether acetate, and ethylene glycol monobutyl ether acetate; propylene glycol monoalkyl ether acetates such as propylene glycol monomethyl ether acetate, propylene glycol monoethyl ether acetate, propylene glycol monopropyl ether acetate, and propylene glycol monobutyl ether acetate; lactates such as methyl lactate, ethyl lactate, propyl lactate, butyl lactate, and amyl lactate; aliphatic carboxylates such as methyl acetate, ethyl acetate, propyl acetate, butyl acetate, amyl acetate, hexyl acetate, methyl propionate, and ethyl propionate; other esters such as methyl 3-methoxypropionate, ethyl 3-methoxypropionate, methyl 3-ethoxypropionate, ethyl 3-ethoxypropionate, methyl 3-methoxy-2-methyl propionate, 3-methoxybutyl acetate, 3-methyl-3-methoxybutyl acetate, butyl 3-methoxy-3-methyl propionate, butyl 3-methyl-3-methyl butyrate, methyl acetoacetate, methyl pyruvate, and ethyl pyruvate; aromatic hydrocarbons such as toluene and xylene; ketones such as 2-heptane, 3-heptane, 4-heptane, and cyclohexanone; amides such as N,N-dimethylformamide, N-methylacetamide, N,N-dimethylacetamide, and N-methylpyrrolidone; and lactones such as γ-lactone. Any of these solvents may be used singly or in the form of a mixture of two or more.

Formation of resist pattern:

When resist patterns are formed using the negative radiation-sensitive resin composition of the present invention, the resist solution prepared described previously may be coated on, e.g., substrates such as silicon wafers or wafers covered with aluminum, by appropriate coating means such as spin coating, cast coating or roll coating to form resist films, and then the resist films are subjected to exposure through given mask patterns.

Radiations usable for the exposure may include, in accordance with the type of the acid-generating agent, ultraviolet radiations such as i-radiations, far-ultraviolet radiations of KrF excimer lasers (wavelength: 248 nm) or ArF excimer lasers (wavelength: 193 nm), X-radiations such as synchrotron radiations, and charged-particle radiations such as electron radiations. Of these, far-ultraviolet radiations may preferably be used. Exposure conditions such as radiation dose may appropriately be selected in accordance with the mixing formulation and so forth for the negative radiation-sensitive resin composition. In the present invention, after exposure, the resist film may preferably be baked in order to make the cross-linking reaction at exposed areas proceed more efficiently. Heating conditions in such a case may vary depending on the mixing formulation and so forth for the negative radiation-sensitive resin composition. Usually, the heating may be carried out at 30 to 200° C., and preferably from 50 to 150° C.

Then, the resist film having been exposed is developed with an alkaline developing solution to form a stated resist pattern.

As the alkaline developing solution, usable are, e.g., alkaline aqueous solutions prepared by dissolving at least one of alkaline compounds such as mono-, di- or tri-alkylamines, mono-, di- or tri-alkanolamines, heterocyclic amines, tetramethylammonium hydroxide, and choline, so as to be in a concentration of usually from 1 to 10% by weight, and preferably from 1 to 5% by weight.

To the alkaline developing solution, an alcohol such as methanol or ethanol and a surface-active agents may also be added in appropriate quantities.

Incidentally, when such developing solutions formed of alkaline aqueous solutions are used, it is common to carry out water washing after the development.

EXAMPLES

The present invention will be described below in greater detail by giving Examples. The present invention should by no means be construed limitative to these Examples.

Measurement and evaluation in the following Examples and Comparative Examples were made in the following way.

Mw and degree of dispersion:

Measured by gel permeation chromatography (GPC) with monodisperse polystyrene as a standard, using in a high-speed GPC apparatus HLC-8120, manufactured by Toso Co. Ltd., GPC columns available from Toso Co. Ltd. (two columns of G2000$H_{XL}$, one column of G3000$H_{XL}$, and one column of G4000$H_{XL}$) under analysis conditions of a flow rate of 1.0 ml/minute, eluting-solvent tetrahydrofuran and a column temperature of 40° C.

Sensitivity:

The amount of exposure that forms a line-and-space pattern (1L1S) of 0.18 μm in designed size in a line width of 1:1 was regarded as optimum amount of exposure. Sensitivity was evaluated by this optimum amount of exposure.

Resolution:

Minimum size of the pattern resolved when exposed at the optimum amount of exposure was regarded as resolution.

Focal latitude (or Depth of forcus(DOF)):

With regard to the line-and-space pattern (1L1S) of 0.18 μm in designed size, focal depth was shifted in each optimum amount of exposure, and the breadth of focal depth in which the pattern line width falls within the range of plus-minus 15% of the designed size was regarded as DOF of each pattern.

The broader DOF a resist has, the higher process margin it has and the higher the yield is at the time of the fabrication of actual devices preferably.

Developability:

Square cross sections of 1L1S patterns of 0.18 μm in line width formed on silicon wafers were observed with a scanning electron microscope to make evaluation according to the following ranks.

○: No undeveloped residue is seen between patterns.

Δ: Some undeveloped residues are seen between patterns.

X: Many undeveloped residues are seen between patterns.

Pattern cross-sectional shape:

Lower-side dimensions La and upper-side dimensions La of the 1L1S patterns of 0.18 μm in line width formed on silicon wafers were measured with a scanning electron microscope. A pattern cross-sectional shape satisfying $$0.85 \leq Lb/La \leq 1$$

and also not round at its upper-layer portions was regarded as "rectangular", to make evaluation according to the following ranks.

○: The pattern cross-sectional shape is rectangular.

Δ: The pattern cross-sectional shape is round at head portions, and the pattern is seen to have been swelled in part.

X: The pattern is seen to have been swelled greatly, and stands serpentine, or no pattern can be formed, Synthesis of Acid-generating Agent Synthesis Example 1

Synthesis of diphenyl-4-hydroxyphenylsulfonium trifluoromethanesulfonate:

To 80 g of a methanesulfonic acid solution of 10% phosphorus pentoxide, 30 g of diphenyl sulfoxide and 20 g of anisole were added under cooling. The mixture obtained was stirred at room temperature for 12 hours in a stream of nitrogen, followed by addition of 200 g of cold water. Ammonia water was dropwise added to the reaction mixture, which was then washed with diethyl ether, and thereafter 80 g of an aqueous solution of 37.5% of potassium trifluoromethanesulfonate was dropwise added thereto with stirring, followed by further stirring for 6 hours under cooling. The deposit formed was washed with water and diethyl ether, followed by drying to obtain 36 g of diphenyl-4-methoxyphenylsulfonium trifluoromethanesulfonate.

To a methylene chloride solution of 20 g of the diphenyl-4-methoxyphenylsulfonium trifluoromethanesulfonate, 90 ml of a 1 M boron tribromide-methylene chloride solution was slowly dropwise added with stirring at room temperature, and the mixture was stirred at room temperature for 2 hours. To the reaction mixture formed, methanol and distilled water were slowly added, followed by drying under reduced pressure to obtain a white crystal compound. The white crystal compound was dissolved in methanol, and ion exchange was effected using an anionic ion-exchange resin (Cl⁻ type), followed by drying under reduced pressure to obtain 11.5 g of diphenyl-4-hydroxyphenylsulfonium chloride.

To an aqueous solution of 11.5 g of the diphenyl-4-hydroxyphenylsulfonium chloride, 22 g of an aqueous 37.5% potassium trifluoromethanesulfonate solution was dropwise added with stirring at room temperature to obtain a white precipitate. The white precipitate was filtered, and then the impurities were washed with distilled water several times, followed by drying under reduced pressure to obtain 10.7 g of the desired diphenyl-4-hydroxyphenylsulfonium trifluoromethanesulfonate.

Synthesis Example 2

Synthesis of diphenyl-4-hydroxyphenylsulfonium toluenesulfonate:

After diphenyl-4-hydroxyphenylsulfonium chloride was obtained in the same manner as in Synthesis Example 1, 22 g of an aqueous 37.5% sodium p-toluenesulfonate solution was dropwise added to an aqueous solution of 11.5 g of the diphenyl-4-hydroxyphenylsulfonium chloride with stirring at room temperature to obtain a white precipitate. The white precipitate was filtered, and then the impurities were washed with distilled water several times, followed by drying under reduced pressure to obtain 10.5 g of the desired diphenyl-4-hydroxyphenylsulfonium p-toluenesulfonate.

Examples 1 to 11 &

Comparative Examples 1 to 3

In each examples, an alkali-soluble resin, acid-generating agent, cross-linking agent, acid-diffusion control agent and solvent were mixed as shown in Table 1, and the mixture obtained was precision-filtered with a filter of 0.2 µm in pore size to remove foreign matter, thus a resist solutions was prepared.

The resist solutions thus obtained in the examples were each spin-coated on a silicon wafer of 8 inches in diameter, followed by baking at 90° C. to form a resist film of 0.6 µm in layer thickness. The resist film were each subjected to exposure using a KrF excimer laser (wavelength: 248 nm), followed by exposure post-baking at 110° C. for 1 minute. Then, using 2.38% by weight of an aqueous solution of tetramethylammonium hydroxide solution, the resist were developed at 23° C. for 60 seconds by the paddle method, followed by washing with water for 30 seconds and then drying to form negative resist patterns.

Resist patterns thus formed were evaluated to obtain the results shown in Table 2.

In Table 1, the respective ingredients are as shown below. The compound marked with an asterisk is a compound not fulfilling the condition of the present invention.

Alkali-soluble resin:

(A-1): p-Hydroxystyrene/styrene copolymer (copolymerization molar ratio: 80/20; Mw: 3,200; Mw/Mn: 1.15

(A-2): p-Hydroxystyrene/styrene copolymer (copolymerization molar ratio: 85/15; Mw: 4,800; Mw/Mn: 1.15

(A-3): p-Hydroxystyrene/styrene copolymer (copolymerization molar ratio: 80/20; Mw: 5,500; Mw/Mn: 1.65)

(A-4): p-Hydroxystyrene/α-methylstyrene copolymer (copolymerization molar ratio: 80/20; Mw: 3,100; Mw/Mn: 1.15

(A-5): p-Hydroxystyrene/styrene copolymer (copolymerization molar ratio: 80/20; Mw: 5,600; Mw/Mn: 1.40)

Acid-generating agent:

(B-1): Diphenyl-4-hydroxyphenylsulfonium trifluoromethanesulfonate (B-2): Diphenyl-4-hydroxyphenylsulfonium toluenesulfonate (B-3)*: Triphenylsulfonium trifluoromethanesulfonate Cross-linking agent:

(C-1): N,N,N,N-tetra(methoxymethyl)glycoluril

Acid-diffusion control agent:

(D-1): Tri-n-octylamine (D-2): Triphenylsulfonium salicylate (D-3): Diphenyl-4-hydroxyphenylsulfonium salicylate Solvent:

(E-1): Ethyl lactate (ethyl 2-hydroxypropionate)

(E-2): Ethyl 3-ethoxypropionate (E-3): Propylene glycol monomethyl ether acetate

TABLE 1

| | Alkali-soluble resin (pbw)* | Acid-generating agent (pbw) | Cross-linking agent (pbw) | Acid-diffusion control agent (pbw) | Solvent (pbw) |
|---|---|---|---|---|---|
| Example 1 | A-1(100) | B-1(2) | C-1(7) | D-1(0.5) | E-1(600) |
| 2 | A-2(100) | B-1(2) | C-1(7) | D-1(0.5) | E-1(600) |
| 3 | A-3(100) | B-1(2) | C-1(7) | D-1(0.5) | E-1(600) |
| 4 | A-1(100) | B-1(2) | C-1(7) | D-2(0.5) | E-1(600) |
| 5 | A-1(100) | B-2(2) | C-1(7) | D-1(0.5) | E-1(600) |
| 6 | A-1(100) | B-2(2) | C-1(7) | D-2(0.5) | E-1(600) |
| 7 | A-1(100) | B-1(2) | C-1(7) | D-3(0.5) | E-1(600) |
| 8 | A-2(100) | B-1(1) | C-1(5) | D-1(0.5) | E-2(600) |
| 9 | A-3(100) | B-1(3) | C-1(8) | D-2(0.5) | E-3(600) |
| 10 | A-4(100) | B-1(2) | C-1(7) | D-1(0.5) | E-1(600) |
| 11 | A-5(100) | B-1(3) | C-1(7) | D-2(0.5) | E-1(600) |
| Comparative Example 1 | A-1(100) | B-3(2) | C-1(7) | D-1(0.5) | E-1(600) |
| 2 | A-1(100) | B-3(1) | C-1(7) | D-1(0.5) | E-1(600) |
| 3 | A-1(100) | B-3(1) | C-1(7) | D-2(0.5) | E-1(600) |

*"pbw" stands for "part(s) by weight".

TABLE 2

| | Sensitivity (mJ/cm²) | Resolution (µm) | Focal latitude (µm) | Developability | Pattern cross-sectional shape |
|---|---|---|---|---|---|
| Example 1 | 30 | 0.16 | 1.2 | ○ | ○ |
| 2 | 27 | 0.16 | 1.2 | ○ | Δ |
| 3 | 32 | 0.17 | 1.0 | ○ | ○ |
| 4 | 30 | 0.15 | 1.4 | ○ | ○ |
| 5 | 32 | 0.16 | 1.0 | ○ | ○ |
| 6 | 31 | 0.15 | 1.2 | ○ | ○ |
| 7 | 30 | 0.16 | 1.4 | ○ | ○ |
| 8 | 30 | 0.17 | 1.1 | ○ | Δ |
| 9 | 30 | 0.16 | 1.2 | ○ | ○ |
| 10 | 32 | 0.17 | 1.2 | ○ | ○ |
| 11 | 30 | 0.15 | 1.2 | ○ | ○ |
| Comparative | No pattern formed* | | | | |

TABLE 2-continued

| | Sensi-<br>tivity<br>(mJ/cm²) | Resolu-<br>tion<br>(μm) | Focal<br>latitude<br>(μm) | Develop-<br>ability | Pattern<br>cross-<br>sec-<br>tional<br>shape |
|---|---|---|---|---|---|
| Example 1 | | | | | |
| 2 | 27 | 0.18 | 0.8 | X | Δ |
| 3 | 28 | 0.17 | 1.0 | X | Δ |

Remarks:
*The rate of dissolution in developing solution was insufficient.

As described above, according to the present invention, the negative radiation-sensitive resin is suitable as a chemically amplified negative resist, to which alkaline developing solutions having usual concentration are applicable and which can form, in usual line-and-space patterns, resist patterns having a high resolution and a rectangular cross-sectional shape and also has superior sensitivity, developability and dimensional fidelity. It also promises superior resolution and pattern cross-sectional shape and moreover is adaptable also to any of far-ultraviolet or shorter, short-wavelength radiations including far-ultraviolet radiations of KrF excimer lasers, X-radiations such as synchrotron radiations and charged-particle radiations such as electron radiations. Accordingly, it can very preferably be used in the fabrication of semiconductor devices which appears to be made much finer hereafter.

What is claimed is:

1. A negative radiation-sensitive resin composition comprising:
   (A) an alkali-soluble resin containing at least one copolymer selected from the group consisting of a hydroxystyrene/styrene copolymer having hydroxystyrene units in a content of from 65 mol % to 90 molt % and a hydroxystyrene/α-methylstyrene copolymer having hydroxystyrene units in a content of from 65 mol % to 90 mol %;
   (B) a radiation-sensitive acid-generating agent containing a hydroxyl group-containing onium salt compound; and
   (C) a cross-linking agent containing an N-(alkoxymethyl) glycoluril compound, wherein the component-(B) radiaton-sensitive acid-generating agent is a compound represented by the following general formula (I) or (II):

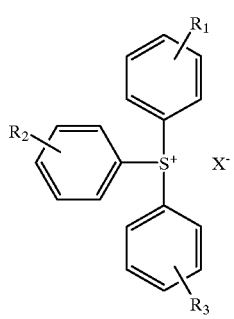

(I)

wherein $R_1$ to $R_3$ may be the same or different and each represent a hydroxyl group, a hydrogen atom, a halogen atom, an alkoxyl group, an alkyl group or a haloalkyl group, provided that at least one of $R_1$, $R_2$ and $R_3$ is a hydroxyl group, and X⁻represents a sulfonate anion:

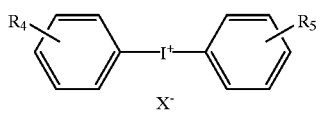

(II)

wherein $R_4$ and $R_5$ may be the same or different and each represent a hydroxyl group, a hydrogen atom, a halogen atom, an alkoxyl group, an alkyl group or a haloalkyl group, provided that at least one of $R_4$ and $R_5$ is a hydroxyl group; and X⁻represents a sulfonate anion.

2. The negative radiation-sensitive resin composition according to claim 1, wherein said hydroxystyrene units in the component (A) are in a content of from 70 mol % to 90 mol %.

3. The negative radiation-sensitive resin composition according to claim 1, wherein the component-(A) copolymer has a weight-average molecular weight of from 2,000 to 8,000 in terms of polystyrene as measured by gel permeation chromatography, and a degree of dispersion of 1.8 or below.

4. The negative radiation-sensitive resin composition according to claim 1, wherein the component-(A) copolymer is a p-hydroxystyrene/styrene copolymer.

5. The negative radiation-sensitive resin composition according to claim 1, wherein the component-(C) cross-linking agent is an N,N,N,N,-tetra(alkoxymethyl)glycoluril represented by the following general formula (III):

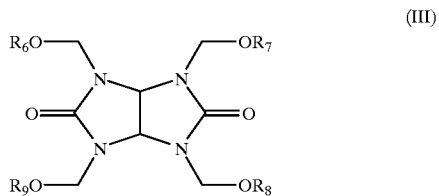

(III)

wherein $R_6$, $R_7$, $R_8$ and $R_9$ each independently represent an alkyl group having 1 to 4 carbon atoms.

6. The negative radiation-sensitive resin composition according to claim 1, wherein the component (C) is N,N,N,N,-tetra(methoxymethyl)glycoluril.

7. The negative radiation-sensitive resin composition according to claim 1, which further comprises an acid diffusion control agent which acts to control the diffusion into resist films of an acid generated from the acid-generating agent upon exposure.

8. The negative radiation-sensitive resin composition according to claim 7, wherein said acid diffusion control agent is a nitrogen-containing basic compound or a radiation-decomposable basic compound.

9. The negative radiation-sensitive resin composition according to claim 8, wherein said nitrogen-containing basic compound is a tertiary-amine.

10. The negative radiation-sensitive resin composition according to claim 8, wherein said radiation-decomposable basic compound is a compound represented by the following general formula (IV):

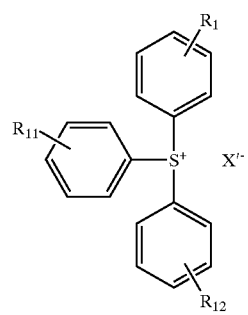

(V)

wherein $R_{10}$ to $R_{12}$ are the same or different and each represent a hydrogen atom, an alkyl group, an alkoxyl group, a hydroxyl group or a halogen atom, and X' represents a hydroxyl, salicylate or RCOO⁻ anion where R is a $C_1$ to $C_{10}$ alkyl group, an aryl group or an alkaryl group, or a compound represented by the following general formulas (V):

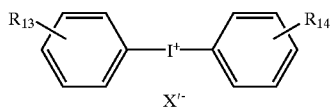

(V)

wherein $R_{13}$ and $R_{14}$ are the same or different and each represent a hydrogen atom, an alkyl group, an alkoxyl group or a halogen atom, and X' represents a hydroxyl, salicylate or RCOO⁻ anion where R is a $C_1$ to $C_{10}$ alkyl group, an alkyl group, an aryl group or an alkaryl group.

11. The negative radiation-sensitive resin composition according to claim 7, wherein said acid diffusion control agent is present in an amount of 0.001 to 10 parts by weight per 100 parts by weight of the component-(A) alkali-soluble resin.

12. The negative radiation-sensitive resin composition according to claim 1, wherein the component-(A) alkali-soluble resin has been produced by anionic addition polymerization or cationic addition polymerization.

13. The negative radiation-sensitive resin composition according to claim 1, wherein the component -(B) radiation-sensitive acid-generating agent is present in an amount of 0.1 to 10 parts by weight per 100 parts by weight of the component-(A) alkali-soluble resin.

14. The negative radiation-sensitive resin composition according to claim 1, wherein the component-(C) cross-linking agent is present in an amount of 2 to 30 parts by weight per 100 parts by weight of the component-(A) alkali-soluble resin.

* * * * *